(12) United States Patent
Herman et al.

(10) Patent No.: US 8,969,865 B2
(45) Date of Patent: Mar. 3, 2015

(54) SEMICONDUCTOR FILM COMPOSITION

(75) Inventors: Gregory Herman, Albany, OR (US);
David Punsalan, Portland, OR (US);
Randy Hoffman, Corvallis, OR (US);
Jeremy Anderson, Corvallis, OR (US);
Douglas Keszler, Corvallis, OR (US);
David Blessing, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1586 days.

(21) Appl. No.: 12/097,869

(22) PCT Filed: Jul. 31, 2006

(86) PCT No.: PCT/US2006/029990
§ 371 (c)(1),
(2), (4) Date: Sep. 30, 2009

(87) PCT Pub. No.: WO2007/046930
PCT Pub. Date: Apr. 26, 2007

(65) Prior Publication Data
US 2010/0044698 A1    Feb. 25, 2010

Related U.S. Application Data

(63) Continuation of application No. 11/248,819, filed on Oct. 12, 2005, now abandoned.

(51) Int. Cl.
*H01L 29/10* (2006.01)
*H01L 29/12* (2006.01)
*H01L 21/02* (2006.01)
*H01L 29/786* (2006.01)

(52) U.S. Cl.
CPC .... *H01L 21/02628* (2013.01); *H01L 21/02554* (2013.01); *H01L 21/02565* (2013.01); *H01L 29/7869* (2013.01)
USPC ....... 257/43; 257/103; 257/201; 257/E29.098

(58) Field of Classification Search
CPC ..................... H01L 29/7869; H01L 29/78693; H01L 21/02554; H01L 21/02565
USPC ............ 257/103, 201, 443, 613, 43, E29.296, 257/E29.098
See application file for complete search history.

(56) References Cited

U.S. PATENT DOCUMENTS 6,214,685 B1 *   4/2001   Clinton et al. ................ 438/382
6,576,568 B2     6/2003   Mandal et al.
(Continued)

FOREIGN PATENT DOCUMENTS

JP    H03256324    11/1991
WO   WO-03021648   3/2003
(Continued)

OTHER PUBLICATIONS

English translation (machine-generated) of Abstract from Japanese Patent Publication No. JPH03256324 [retrieved on Oct. 7, 2014], Retrieved from the Internet: http://worldwide.espacenet.com/publicationDetails/biblio?CC=JP&NR=H03256324A&KC=A&FT=D&ND=3&date=19911115&DB=worldwide.espacenet.com&locale=en_EP.
(Continued)

*Primary Examiner* — Jesse Y Miyoshi
(74) *Attorney, Agent, or Firm* — Dierker & Associates, P.C.

(57) ABSTRACT

A semiconductor film composition includes an oxide semiconductor material. At least one polyatomic ion is incorporated into the oxide semiconductor material.

7 Claims, 3 Drawing Sheets

(56) References Cited

U.S. PATENT DOCUMENTS

| | | |
|---|---|---|
| 6,709,564 B1 | 3/2004 | Tench et al. |
| 6,709,958 B2 | 3/2004 | Li et al. |
| 7,402,506 B2 * | 7/2008 | Levy et al. .................... 438/584 |
| 2002/0190251 A1 | 12/2002 | Kunitake et al. |
| 2004/0046168 A1 | 3/2004 | Andriessen |
| 2005/0009225 A1 | 1/2005 | Mitzi et al. |
| 2005/0009248 A1 | 1/2005 | Weng et al. |
| 2005/0019976 A1 | 1/2005 | Xiao et al. |

FOREIGN PATENT DOCUMENTS

| | | |
|---|---|---|
| WO | WO-2006137915 | 12/2006 |
| WO | WO-2006138072 | 12/2006 |

OTHER PUBLICATIONS

Karuppuchamy et al., Cathodic electrodeposition of oxide semiconductor thin films and their application to dye-sensitized solar cells, Solid State Ionics, Nov. 2002.

Ohya et al., Rectifying Properties of Oxide Semiconductor Heterostack Films at Elevated Temperatures, Journal of Sol-Gel Science and Technology, Mar. 2005, pp. 323-326, vol. 33.

Transmittal of the International Search Report and the Written Opinion of the International Searching Authority PCT/US2006/029990 dated Feb. 1, 2007.

* cited by examiner

SEMICONDUCTOR FILM COMPOSITION

CROSS-REFERENCE TO RELATED APPLICATIONS

This application is a 35 U.S.C. 371 national stage filing of PCT/US2006/029990, filed Jul. 31, 2006, which itself claims priority to, and is a continuation of U.S. patent application Ser. No. 11/248,819, filed Oct. 12, 2005 (now abandoned).

BACKGROUND

The present disclosure relates generally to film compositions, and more particularly to semiconductor film compositions.

Solution processing may be used to form semiconductor films from precursor solutions. Solution processing may be desirable since, in some instances, it enables certain thin-film deposition processes, including inkjet printing, to be used in manufacturing relatively low-cost electronics. Both organic and inorganic materials may be solution processed.

Generally, organic materials are well suited for the constraints of low temperature processing techniques, including solution-based processing. However, organic materials may provide relatively poor performance, such as inefficient electronic charge transport (i.e., low carrier mobility). Another potential problem with organic electronic materials and devices is that they may have limited stability and/or useful lifetimes.

Inorganic films, such as oxide semiconductors, formed from solution processes may experience undesirable morphological changes (one example of which is cracking) upon crystallization, which may occur when a liquid precursor is converted to the solid film. Further, inorganic films may, in some instances, experience a reduction in charge transport efficiency, (i.e., mobility) due, at least in part, to charged defects at grain boundaries in a poly-crystalline film.

As such, it would be desirable to provide a solution processed inorganic film substantially free from undesirable morphological changes.

SUMMARY

A semiconductor film composition is disclosed. The composition includes an oxide semiconductor material and at least one polyatomic ion. The polyatomic ion(s) is/are incorporated into the oxide semiconductor material, thereby forming the semiconductor film composition.

BRIEF DESCRIPTION OF THE DRAWINGS

Features and advantages of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiment(s) of the film disclosed herein incorporate polyatomic ions. In an embodiment, the polyatomic ions are incorporated as metal oxide salt compositions in semiconductor films. As such, the films may advantageously have metal oxide and metal salt entities.

Embodiment(s) of the film may be adapted for use as a variety of electronic devices and/or within a variety of electronic devices. The liquid precursor used to form embodiment(s) of the film may advantageously be polymerized at relatively low processing temperatures. Further, the liquid precursor contains polyatomic ions that may act to substantially inhibit crystallization, thus allowing the formed solid film to retain a substantially amorphous structure across a broad range of processing temperatures. It is to be understood that some embodiments of the film may have some degree of crystallinity without having distinct grains. Without being bound to any theory, it is believed that substantially inhibiting crystallization during film formation advantageously reduces or substantially eliminates undesirable morphological changes in the film. Further, embodiments of the films may substantially avoid potentially dominant grain-boundary-related mobility reductions, and may exhibit higher mobility than that of a poly-crystalline film formed using similar solution-processing methods. Still further, embodiments of the film may have increased stability and useful life as compared to an organic solution-processed film.

Embodiment(s) of the present disclosure form semiconductor film compositions. It is to be understood that, in one or more embodiments as disclosed herein, these semiconductor film compositions may be oxide salt semiconductor films.

Figure 1:
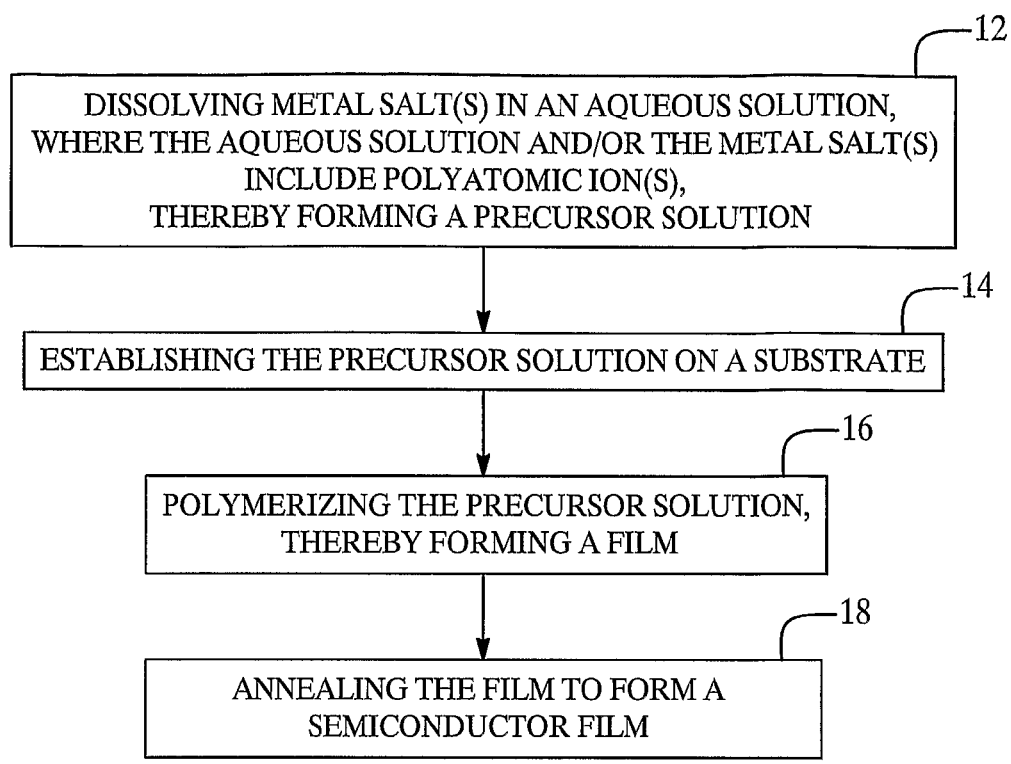
FIG. 1 is a flow diagram depicting an embodiment of a method of making an oxide salt semiconductor film.

Referring now to FIG. 1, an embodiment of the method of forming an oxide salt semiconductor film is depicted. The method generally includes dissolving metal salt(s) in an aqueous solution to form a precursor solution, where the aqueous solution and/or the metal salt(s) include polyatomic ion(s) (PAI), as shown at reference numeral 12. The precursor solution is established on a substrate, as shown at reference numeral 14. The precursor solution is polymerized, thereby forming a film, as shown at reference numeral 16. The film is then annealed to form the oxide salt semiconductor film, as shown at reference numeral 18.

Embodiments of the film composition as formed by the method(s) disclosed herein include an oxide semiconductor material having the polyatomic ion(s) incorporated into the oxide semiconductor material, thus forming an oxide salt semiconductor film. It is to be understood that the incorporation of the polyatomic ion into the oxide semiconductor results in a semiconductor that may contain metal oxide, metal salt, and polyatomic ion entities.

In an example, a polyatomic anion (PAA) is incorporated into the oxide semiconductor film. Generically, the oxide semiconductor film may be depicted as $M_wO_x$, and the oxide salt semiconductor film having the polyatomic anion incorporated therein may be depicted as $M_wO_{x-y}(PAA)_{2y/z}$, where z is the charge on the polyatomic anion. In an embodiment, the polyatomic anion(s) is incorporated as a metal salt in the film. In an embodiment, the polyatomic anion(s) may replace an oxygen group(s) in the film. It is to be understood that the formulas are not necessarily representative of a balanced equation, as the oxide semiconductor salt film incorporating the polyatomic ion is formed from a precursor solution, which may not include the analog (i.e., the semiconductor film not incorporating the polyatomic anion) of the film.

A non-limiting example of the oxide salt semiconductor film is a tin oxide phosphate film having the chemical formula $SnO_{1.7}(PO_4)_{0.2}$, and its corresponding analog is a tin oxide film having the chemical formula $SnO_2$. As depicted, the oxide salt semiconductor film is modified from the analog oxide semiconductor in that the polyatomic anion, in this example phosphate from a tin phosphate, is incorporated into the tin oxide analog.

Generally, the charge balance of the oxide salt semiconductor film should be maintained for semiconductors. This may advantageously prevent the formation of excess carriers that may result in a film that is too conductive. In a non-limiting example, it is believed that charge balance may be achieved by substituting, for example, a $(SO_4)^{2-}$ group for an $O^{2-}$ anion.

In general, a polyatomic anion or a polyatomic cation may be incorporated into an anion or a cation entity in the film. A non-limiting example of such an anion incorporation includes a $(SO_4)^{2-}$ group replacing a $(SnO_3)^{2-}$ group, and a non-limiting example of such a cation incorporation includes a $S^{6+}$ and an $O^{2-}$ replacing a $Sn^{4+}$. In another embodiment, the polyatomic ion may replace a cation and surrounding oxygen group(s).

In an embodiment, the oxide salt semiconductor material includes at least one cation species. Non-limiting examples of the cation species include zinc, cadmium, gallium, indium, germanium, tin, copper, silver, lead, antimony, bismuth, and/or combinations thereof. The cation species in the oxide salt semiconductor material may be supplied from the metal salt(s) used during formation of the film.

It is to be understood that the film may also contain other species (a non-limiting example of which includes hydroxide) depending, at least in part, on the processing conditions.

Referring back to the method of forming the oxide salt semiconductor film, one or more metal salts are added to an aqueous solution to form the precursor solution. The salts may be substantially completely dissolved, and the precursor solution may be heterogeneous, homogeneous, or both heterogeneous in some portions and homogeneous in other portions. It is to be understood that the aqueous solution and/or the metal salts(s) may include the polyatomic ion(s). Non-limiting examples of suitable polyatomic ions include ions of sulfates, borates, phosphates, tungstates, silicates, and/or combinations thereof.

Generally, the aqueous solution includes water, or a mixture of water and an acid. In an embodiment where the aqueous solution includes the polyatomic ions, the aqueous solution may include water and an acid having the polyatomic ion. Examples of acids having polyatomic ion(s) include, but are not limited to phosphoric acid, sulfuric acid, boric acid, tungstic acid, silicic acid, and/or combinations thereof. In this embodiment, the molarity of the acid in the precursor solution ranges from about 0.001 M to about 1.0 M.

In an embodiment where the metal salt, or a mixture of metal salts, includes the polyatomic ion, the metal salt(s) may be dissolved in water. It is to be understood that in this embodiment, a polyatomic ion acid may be added to the precursor solution. The salt component of the metal salt (which metal salt may include the polyatomic ion(s)) includes, but is not limited to sulfate salts, borate salts, phosphate salts, tungstate salts, silicate salts, and/or combinations thereof. Other suitable salt components of the metal salt that may be added to the precursor solution include, but are not limited to iodide salts, bromide salts, chloride salts, perchlorate salts, nitrate salts, acetate salts, formate salts, and/or combinations thereof. The amount of salt in the precursor solution may depend, at least in part, on the film that is to be formed. In one embodiment, the molarity of the salt in the precursor solution ranges from about 0.1 M to about 1.0 M.

After the precursor solution is formed, it may be established on a substrate. Examples of suitable substrate materials include, but are not limited to silicon, quartz, sapphire, glass, metal foils, and various organic substrates, such as polycarbonates (PC), polyarylates (a non-limiting example of which is commercially available under the tradename ARYLITE from Promerus located in Brecksville, Ohio), polyethylene terephthalate (PET), polyestersulfones, polyimides (a non-limiting example of which is commercially available under the tradename KAPTON from DuPont located in Circleville, Ohio), polyolefins, polyethylene naphthalate (PEN), polyethersulfone (PES), polynorbornene (a non-limiting example of which is commercially available under the tradename APPEAR 3000 from Promerus located in Brecksville, Ohio), polyetheretherketone (PEEK), polyetherimide (PEI) (a non-limiting examples of which is commercially available under the tradename ULTEM from General Electric Company, located in Fairfield, Conn.), and/or combinations thereof.

Any suitable deposition technique may be used to establish the precursor solution on the substrate. In an embodiment, the deposition technique is a solution processing technique. Non-limiting examples of such deposition techniques include inkjet printing processes, gravure printing processes, direct write processing, spin-coating processes, spray-coating processes, dip-coating processes, curtain coating processes, and/or the like, and/or combinations thereof.

It is to be understood that the precursor solution may be established on the substrate at any desirable thickness. In an embodiment, the thickness of the established precursor solution may range from about 10 nm to about 1000 nm. The thickness of the final film may range from about 5 nm to about 500 nm, and may be greater than about 500 nm.

In an embodiment, the method further includes polymerizing the precursor solution. Polymerization initiates the formation of chemical bonds in the metal oxide salt semiconductor precursor and assists in the incorporation of the polyatomic ion into the semiconductor material. Polymerization of the precursor solution may be accomplished by any suitable means. In an embodiment, polymerization is accomplished by adding initiators to the precursor solution; exposing the precursor solution to radiation (e.g. ultraviolet radiation); exposing the precursor solution to heat; modifying the constituents in solution by evaporation of the solvent or removal of complexants; and/or combinations thereof. In a non-limiting example embodiment, heating the precursor solution at relatively low temperatures, including temperatures of about 50° C., may initiate polymerization. Heating may be accomplished via a hot plate, furnace, laser, microwave, or the like, or combinations thereof.

In one embodiment, the polymerized film having the polyatomic ion incorporated therein may be established in contact with a second film that generally does not include the polyatomic ion therein. The polyatomic ion(s) may diffuse from the polymerized film into the second film, thereby forming a second film having the polyatomic ions incorporated therein.

The method may further include annealing the polymerized film. Annealing may take place at any suitable temperature. In one embodiment, annealing temperatures may range from about 100° C. to about 600° C., and in another embodiment, annealing temperatures may range from about 250° C. to about 400° C. Annealing the polymerized film results in the formation of the oxide salt semiconductor film having in its composition the polyatomic ion(s) directly incorporated into the semiconductor material. Non-limitative examples of the formed film include tin oxide phosphate, indium tin oxide sulfate, indium tin oxide phosphate, tin oxide sulfate, zinc oxide phosphate, and indium oxide phosphate, and/or the like, and/or combinations thereof.

It is to be understood that annealing of the polymerized film may substantially volatilize excess solvent(s), compounds containing the initial salts and ions, and organic(s) that may be present in the precursor solution or that may be byproducts of the reaction that forms the oxide salt semiconductor film.

Embodiment(s) of the precursor solution are capable of substantially inhibiting crystallization during formation of the oxide salt semiconductor film. As previously stated, this may advantageously substantially eliminate morphological changes (a non-limitative example of which is cracking) in the resulting film. Without being bound to any theory, it is believed the film structure may advantageously increase the suitability of the oxide salt semiconductor film for electronic applications.

It is to be understood that the oxide salt semiconductor film may be incorporated into a variety of electronic devices. In a non-limiting example, the film is operatively disposed in a display device. It is to be further understood that the oxide salt semiconductor film may be adapted for use as a thin-film electronic device, including, but not limited to thin-film transistors and diodes. The oxide salt semiconductor films may also be adapted for use as components in thin-film electronic devices, such as, for example, thin-film transistor channel layers. The precursor solution may be capable of undergoing fabrication processes for forming thin-film electronic devices and/or components thereof.

Still further, the oxide salt semiconductor film may have an electrical conductivity that is adapted to be modulated via the application of an electric field normal to a surface of the oxide film. In a non-limitative example, the electric field normal to the surface of the oxide salt semiconductor film is applied via a gate electrode of a field-effect transistor structure. In an embodiment, a ratio of maximum conductivity of the film to minimum conductivity of the film (as modulated by the gate electrode field) is at least 10, and in another embodiment is at least $10^4$. Such a field-effect transistor may be useful in numerous applications, such as, for example, a voltage-controlled switch or a voltage-controlled current source. A voltage-controlled switch may be used to control a voltage level in an active-matrix display backplane and a voltage-controlled current source may be used to supply a controlled current in an active-matrix display backplane.

To further illustrate embodiment(s) of the present disclosure, the following examples are given. It is to be understood that these examples are provided for illustrative purposes and are not to be construed as limiting the scope of embodiment(s) of the present disclosure.

Example 1

About 40 parts by volume of 0.8 M $SnCl_2$, about 119 parts by volume of $H_2O$, and about 1 part by volume of 0.6 M $H_3PO_4$ were added together to form the precursor solution for a tin oxide phosphate film. The precursor solution was annealed at a temperature of about 500° C. to form the tin oxide phosphate film.

Figure 2:
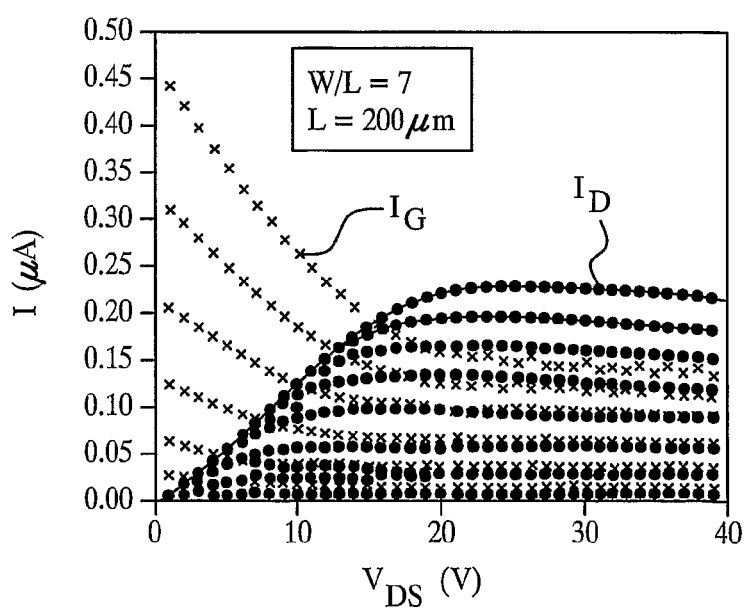
FIG. 2 is a graph depicting $I_D$-$V_{DS}$ and $I_G$-$V_{DS}$ curves of an embodiment of a thin-film transistor including an oxide salt semiconductor film formed using an embodiment of the method.

FIG. 2 illustrates the $I_D$-$V_{DS}$ and $I_G$-$V_{DS}$ curves of a thin-film transistor including the tin oxide phosphate film formed in Example 1 as a channel layer. This thin-film transistor is formed on a heavily-doped p-type silicon wafer, the wafer being thermally oxidized to form a gate dielectric layer (100 nm $SiO_2$). The tin oxide phosphate channel layer is disposed via spin-coating over the gate dielectric. Aluminum source and drain electrodes are deposited by thermal evaporation through a shadow mask.

The curves were measured using a semiconductor parameter analyzer. The drain current, $I_D$, and the gate current, $I_G$, were measured while sweeping the drain-source voltage ($V_{DS}$) from 0 to 40V at a fixed gate-source voltage ($V_{GS}$). The gate-source voltage ($V_{GS}$) was stepped from 0 to 40V in 5V increments. The $I_D$-$V_{DS}$ curve with the largest $I_D$ values corresponds to $V_{GS}$=40 V, the next $I_D$-$V_{DS}$ curve corresponds to $V_{GS}$=35 V, and so on, as expected for an n-channel field-effect transistor.

Figure 3:
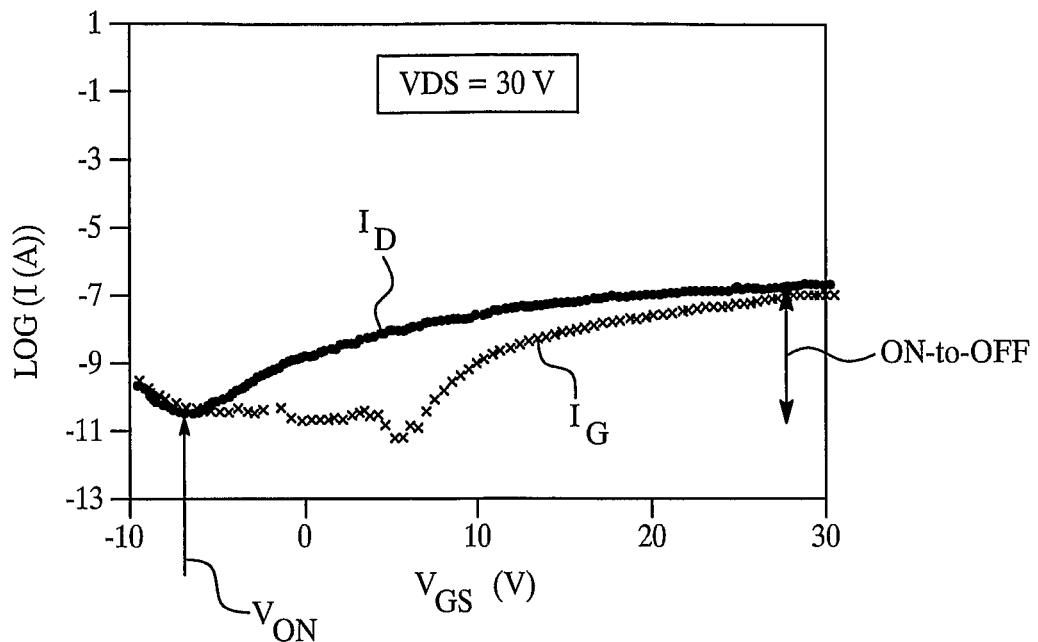
FIG. 3 is a graph depicting $\log(I_D)$-$V_{GS}$ and $\log(|I_G|)$-$V_{GS}$ curves of an embodiment of a thin-film transistor including an oxide salt semiconductor film formed using an embodiment of the method.

FIG. 3 illustrates the $\log(I_D)$-$V_{GS}$ and $\log|I_G|$-$V_{GS}$ curves of the semiconductor formed in Example 1. The curves were measured using a semiconductor parameter analyzer. A drain-source voltage was held constant at about 30V, while the gate-source voltage was swept from −10 to 30 V. The data reveals an on/off ratio of about $1 \times 10^4$ and a turn on voltage of about −7V. While the mobility extracted from the $I_D$ data was relatively low, one can apprehend the viability of the oxide salt semiconductor films.

Example 2

Figure 4:
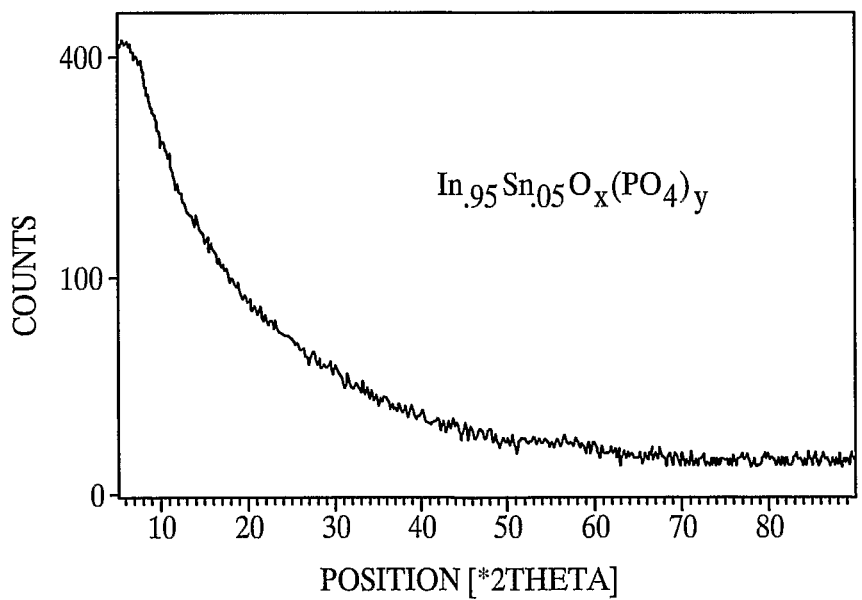
FIG. 4 is a graph depicting the X-ray diffraction of an indium tin oxide phosphate film formed using an embodiment of the method.

0.38 M $In(NO_3)_3 \cdot H_2O$, 0.02 M $SnCl_2 \cdot 2H_2O$, 0.5 M HCl, 0.2 M $H_2O_2$, and from about 0.15 M to about 1.0 M $H_2PO_4$ were added together to form the precursor solution for an indium tin oxide phosphate film ($In_{0.95}Sn_{0.05}O_x(PO_4)_y$). The precursor solution was annealed at about 400° C. to form the film. FIG. 4 is a graph of the X-ray diffraction of the formed indium tin oxide phosphate film. As illustrated, the X-ray diffraction shows substantially no indication of a crystalline phase in the film.

Example 3

Figure 5:
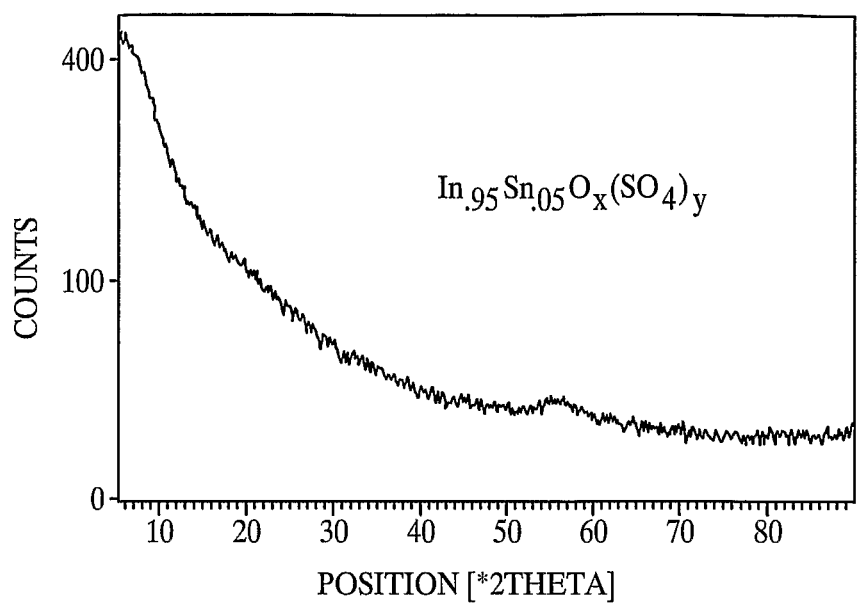
FIG. 5 is a graph depicting the X-ray diffraction of an indium tin oxide sulfate film formed using an embodiment of the method.

0.38 M $In(NO_3)_3 \cdot H_2O$, 0.02 M $SnCl_2 \cdot 2H_2O$, 0.5 M HCl, 0.2 M $H_2O_2$, and from about 0.15 to about 1.0 M $H_2SO_4$ were added together to form the precursor solution for an indium tin oxide sulfate film ($In_{0.95}Sn_{0.05}O_x(SO_4)_y$). The precursor solution was annealed at about 400° C. to form the film. FIG. 5 is a graph of the X-ray diffraction of the formed indium tin oxide sulfate film. As illustrated, the X-ray diffraction shows substantially no indication of a crystalline phase in the film.

Example 4

A dielectric, semiconductor, or conductor film is formed so that it has polyatomic ions therein. This film is established in contact with a second film (e.g. a semi-conducting material) that is essentially free of polyatomic ions. The polyatomic ions in the first film may diffuse into the second film, thereby incorporating the polyatomic ions into the second film. The second film may be annealed to form an oxide salt semiconductor having polyatomic ions incorporated therein.

Embodiment(s) of the method and the oxide salt semiconductor film described herein include, but are not limited to the following advantages. Without being bound to any theory, it is believed that the incorporation of the polyatomic ions into the oxide salt semiconductor films may advantageously substantially reduce or eliminate the potential deleterious effects (non-limitative examples of which include film cracking, grain boundary effects, and the like) often seen in other solution processed inorganic oxide semiconductors. As such, embodiments of the film may not have reduced mobility that is often a characteristic of poly-crystalline semiconductor films. Still further, embodiment(s) of the film may have increased stability and useful life when compared to solution processed organic materials.

While several embodiments have been described in detail, it will be apparent to those skilled in the art that the disclosed embodiments may be modified. Therefore, the foregoing description is to be considered exemplary rather than limiting.

What is claimed is:

1. A semiconductor film composition, comprising:
   an oxide semiconductor material; and
   at least one polyatomic ion incorporated into the oxide semiconductor material as a replacement ion for an anion entity or a cation entity of an analog of the oxide semiconductor material, wherein the analog is the oxide semiconductor material with the anion entity or the cation entity and without the polyatomic ion;
   wherein the semiconductor film composition is $SnO_{1.7}(PO_4)_{0.2}$, indium tin oxide sulfate or indium tin oxide phosphate.

2. The semiconductor film composition as defined in claim 1 wherein the at least one polyatomic ion is selected from sulfates, borates, phosphates, tungstates, silicates, and combinations thereof.

3. The semiconductor film composition as defined in claim 1 wherein a liquid precursor of the semiconductor film composition is adapted to substantially inhibit crystallization during processing.

4. The semiconductor film composition as defined in claim 1 wherein the polyatomic ion is an anion or a cation.

5. The semiconductor film composition as defined in claim 1 wherein: the anion entity of the analog of the oxide semiconductor material is an $O^{2-}$ anion; and the polyatomic ion is a phosphate or a sulfate.

6. The semiconductor film composition as defined in claim 1 wherein the semiconductor film composition is substantially amorphous.

7. A semiconductor film composition, comprising:
   an oxide semiconductor material; and
   at least one polyatomic ion incorporated into the oxide semiconductor material as a replacement ion for an anion entity or a cation entity of an analog of the oxide semiconductor material, wherein the analog is the oxide semiconductor material with the anion entity or the cation entity and without the polyatomic ion;
   wherein the semiconductor film composition is $SnO_{1.7}(PO_4)_{0.2}$ and the analog is $SnO_2$.

* * * * *